United States Patent
Kohno

(10) Patent No.: US 9,728,372 B2
(45) Date of Patent: Aug. 8, 2017

(54) MEASUREMENT METHOD AND ELECTRON MICROSCOPE

(71) Applicant: JEOL Ltd., Tokyo (JP)

(72) Inventor: Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/053,225

(22) Filed: Feb. 25, 2016

(65) Prior Publication Data

US 2016/0254118 A1    Sep. 1, 2016

(30) Foreign Application Priority Data

Feb. 27, 2015   (JP) .................................. 2015-38469

(51) Int. Cl.
  *H01J 37/28*   (2006.01)
  *H01J 37/05*   (2006.01)
  *H01J 37/22*   (2006.01)

(52) U.S. Cl.
  CPC ............ *H01J 37/222* (2013.01); *H01J 37/28* (2013.01); *H01J 2237/24455* (2013.01); *H01J 2237/24465* (2013.01); *H01J 2237/2802* (2013.01); *H01J 2237/2803* (2013.01)

(58) Field of Classification Search
  CPC .......... H01J 37/28; H01J 37/244; H01J 37/05; H01J 37/26; H01J 37/153; H01J 37/222; H01J 37/263; H01J 37/265; H01J 37/09; H01J 37/1471; H01J 37/252; H01J 37/256; H01J 37/261; H01J 37/2955; G01N 23/2251; G01N 23/04
  USPC .... 250/311, 310, 306, 305, 307, 397, 396 R, 250/491.1, 308, 309, 358.1, 359.1, 361 R, 250/363.07, 370.08, 398; 382/128, 131, 382/154
  See application file for complete search history.

(56) References Cited

U.S. PATENT DOCUMENTS

| | | | | |
|---|---|---|---|---|
| 6,570,156 | B1 * | 5/2003 | Tsuneta ................... | H01J 37/26 250/311 |
| 6,703,613 | B2 * | 3/2004 | Kaji .................. | G01N 23/2251 250/305 |
| 6,930,306 | B2 * | 8/2005 | Kaji ........................ | H01J 37/05 250/305 |
| 7,525,090 | B1 * | 4/2009 | Krzeczowski ........ | H01J 37/263 250/306 |
| 7,723,682 | B2 * | 5/2010 | Terada ................... | H01J 37/05 250/305 |

(Continued)

FOREIGN PATENT DOCUMENTS

JP       2011243516 A    12/2011

*Primary Examiner* — David A Vanore
(74) *Attorney, Agent, or Firm* — The Webb Law Firm

(57) ABSTRACT

A measurement method capable of easily measuring the directions of detector segments of a segmented detector relative to a scanning transmission electron microscope (STEM) image is provided. The measurement method is for use in an electron microscope equipped with the segmented detector having a detection surface divided into the detector segments. The measurement method is used to measure the directions of the detector segments relative to the STEM image. The method involves defocusing the STEM image to thereby cause a deviation of the STEM image and measuring the directions of the detector segments relative to the STEM image from the direction of the deviation of the STEM image (step S11).

10 Claims, 17 Drawing Sheets

(56) References Cited

U.S. PATENT DOCUMENTS

| | | | | |
|---|---|---|---|---|
| 7,838,833 B1* | 11/2010 | Lent | .................. | G01N 23/2251 |
| | | | | 250/310 |
| 7,928,376 B2* | 4/2011 | Kaji | .................... | H01J 37/256 |
| | | | | 250/305 |
| 8,263,936 B2* | 9/2012 | Terada | .................. | G01N 23/04 |
| | | | | 250/305 |
| 8,436,301 B2* | 5/2013 | Terada | .................. | H01J 37/05 |
| | | | | 250/306 |
| 8,698,078 B2* | 4/2014 | Phifer, Jr. | ............. | H01J 37/222 |
| | | | | 250/306 |
| 2013/0099117 A1* | 4/2013 | Akima | ................ | H01J 37/153 |
| | | | | 250/311 |

\* cited by examiner

MEASUREMENT METHOD AND ELECTRON MICROSCOPE

BACKGROUND OF THE INVENTION

Field of the Invention

The present invention relates to a measurement method and also to an electron microscope.

Description of Related Art

A scanning transmission electron microscope (STEM) is an electron microscope for obtaining scanning transmission electron microscope (STEM) images by scanning a focused electron beam over a sample, detecting a signal originating either from electrons transmitted through the sample or from scattering electrons, and mapping the intensities of the signal in synchronism with the scanning. In recent years, scanning transmission electron microscopes have attracted attention as electron microscopes capable of providing quite high spatial resolutions at the atomic level.

A segmented detector whose detection surface is divided into plural detector segments is known as an electron detector equipped in such a scanning transmission electron microscope. The segmented detector has independent detection systems for the detector segments, respectively. Each detection system detects only electrons striking a respective one of the detector segments on the detection surface. A scanning transmission electron microscope performs imaging while bringing the detection surface into coincidence with the diffraction plane. That is, this is equivalent to detecting electrons transmitted and scattering within a certain solid-angle region from a sample. Consequently, this presents the advantage that the use of a segmented detector permits one to simultaneously measure the solid angle dependence of scattering of electrons caused by the sample and to obtain a quantitative evaluation (see, for example, JP-A-2011-243516).

FIG. 15 illustrates the operation of a scanning transmission electron microscope 101 equipped with a conventional segmented detector. Note that only main portions of the microscope 101 are shown in FIG. 15.

In the scanning transmission electron microscope 101, as shown in FIG. 15, an electron beam EB is focused onto the surface of a sample S by an illumination lens system 102. The camera length is adjusted by an imaging lens system 104 for the electron beam EB transmitted through the sample S. Then, the beam is detected by the segmented detector, 106. A CCD camera 108 is positioned behind the segmented detector 106.

The differential phase contrast (DPC) technique is known as a technique of visualizing an electromagnetic field produced in a sample using a scanning transmission electron microscope equipped with such a segmented detector. In this technique, an amount by which an electron beam is deflected when it passes through a sample is measured, and the electromagnetic field in the sample causing the deflection is computed.

When a measurement is made using the DPC technique, it is necessary to align the directions of the detector segments of the segmented detector to an STEM image. If the directions of the detector segments relative to the STEM image are not known, then it is impossible to identify the direction of an electromagnetic field that acts on the electron beam transmitted through the sample to thereby deflect the beam.

FIG. 16A is a diagram illustrating one example of the relationship between the crystallographic orientation of the sample S and the orientations of detector segments D1, D2, D3, and D4 of the segmented detector 106. FIG. 16B schematically shows an image I(D2-D4) produced by taking the difference between STEM images obtained from the detector segments D2 and D4, respectively, as well as an image I(D1-D3) produced by taking the difference between STEM images obtained from the detector segments D1 and D3, respectively.

As shown in FIG. 16A, the detector segments D1-D4 are so arranged that the detector segments D2 and D4 are aligned in the [110] direction and that the detector segments D1 and D3 are aligned in the [110] direction. Under this condition, STEM images are taken from the detector segments D1, D2, D3, and D4, respectively. Then, the image I(D2-D4) and the image I(D1-D3) shown in FIG. 16B are generated. The X direction of the captured STEM images lies in the [110] direction of the sample S, while the Y direction of the STEM images lies in the [110] direction of the sample S.

Information about the deflection in the [110] direction produced when the electron beam passes through the sample can be obtained from the image I(D2-D4) shown in FIG. 16B. Information about the deflection in the [110] direction can be derived from the image I(D1-D3). The distribution of the electromagnetic field, for example, in the sample can be known from the relationship between the crystallographic orientation and the deflection.

A conventional method of measuring the directions of the detector segments D1, D2, D3, and D4 of the segmented detector 106 relative to the STEM images is now described by referring to FIGS. 17-22. In order to know the directions of the detector segments D1, D2, D3, and D4 of the segmented detector 106 relative to the STEM images, the imaging lens system 104 is first adjusted. A setup is made such that the surface of the sample is conjugate with the detection surface 105 as shown in FIG. 17. Under this condition, if scanning is done, an image I1 of the shape of the detection surface 105 can be obtained as shown in FIG. 18. If the segmented detector 106 is retracted and an image I2 (see FIG. 19) of a probe that is scanned by the CCD camera 108 is obtained, the active detector segment being scanned can be confirmed. By combining these images, the azimuthal relationship of the detector segments D1, D2, D3, and D4 of the detection surface 105 to the CCD camera 108 can be known as shown in FIG. 20.

Then, the setup for obtaining STEM images as shown in FIG. 15 is resumed. Under this condition, an image I4 of a shadow of an aperture (not shown) of the illumination system is observed as shown in FIG. 21A. If the image is defocused and the detection surface 105 is moved off the diffraction plane, the shadow of the aperture moves along with the scanning. For example, if a scan is made only in the X direction and an image capture is made with a long exposure time, an image I5 indicating a trajectory of the shadow of the aperture is obtained as shown in FIG. 21B. The directions of the detector segments D1, D2, D3, and D4 of the segmented detector 106 relative to the STEM image are known as shown in FIG. 22 from the direction of motion a of the shadow of the aperture and from the directions of the detector segments D1-D4 of the detection surface 105 appearing in an image I3 shown in FIG. 20. The direction a shown in FIG. 22 is the X direction of the STEM image.

In this way, in the conventional method of measuring the directions of the detector segments relative to an STEM image, two operations have been performed. In the first operation, the sense of the CCD camera relative to the segmented detector is measured. In the second operation, the sense of the CCD camera relative to the direction of scanning is measured. Therefore, in the conventional measurement method, it is time-consuming simply to obtain the images I1-I5 needed for a measurement. The directions of the detector segments of the segmented detector relative to an STEM image vary simply when the scanning direction is changed. Therefore, if the above-described measurement is performed whenever the scanning direction is varied, a heavy burden is placed on the user. Furthermore, the conventional measurement method needs a CCD camera.

SUMMARY OF THE INVENTION

In view of the foregoing problems, the present invention has been made. One object associated with some aspects of the invention is to provide a measurement method capable of easily measuring the directions of detector segments of a segmented detector relative to a scanning transmission electron microscope (STEM) image or images. Another object associated with some aspects of the invention is to provide an electron microscope capable of measuring the directions of detector segments of a segmented detector relative to an STEM image or images easily.

(1) A measurement method associated with the present invention is for use in an electron microscope equipped with a segmented detector having a detection surface that is divided into a plurality of detector segments. The measurement method is adapted to measure the directions of the detector segments relative to at least one scanning transmission electron microscope (STEM) image. This measurement method comprises defocusing the STEM image to thereby cause a deviation of the STEM image and measuring the directions of the detector segments relative to the STEM image from the direction of the deviation of the STEM image.

In this measurement method, the directions of the detector segments relative to the STEM image can be measured easily. Furthermore, in this method, the directions of the detector segments relative to the STEM image can be measured without using a CCD camera or other hardware device.

(2) In one feature of this measurement method, the at least one STEM image is plural in number. During the step of measuring the directions of the detector segments, the directions of the detector segments may be found from the direction of a relative positional deviation between plural ones of the STEM images which are obtained from the same one of the detector segments but which are different in amount of defocus.

In this measurement method, the directions of the detector segments relative to the STEM images can be measured easily.

(3) In another feature of this measurement method, during the step of measuring the directions of the detector segments, the directions of the detector segments may be found from the direction of a relative positional deviation between plural different ones of the STEM images which are obtained from the detector segments under a defocused condition.

With this measurement method it is easy to measure the directions of detector segments relative to STEM images. Furthermore, in this method, STEM images used for a measurement can be obtained in one image capture operation.

(4) In a further feature of this measurement method, two STEM images may be obtained as said at least one STEM image from two different ones of the detector segments under a defocused condition. During the step of measuring the directions of the detector segments, an image may be generated by subtracting one of these two STEM images from the other.

In this measurement method, two STEM images are obtained from two different ones of the detector segments under a defocused condition, and the directions of the detector segments relative to STEM images can be easily known from an image that is obtained by subtracting one of these two STEM images from the other.

(5) In one feature of the measurement method set forth in (4) above, the two detector segments may be located at opposite positions.

(6) An electron microscope associated with the present invention is adapted to obtain at least one STEM image by detecting electrons transmitted through a sample. The electron microscope has: a segmented detector having a detection surface for detecting the electrons transmitted through the sample, the detection surface being divided into a plurality of detector segments; and an arithmetic section for finding the directions of the detector segments relative to the STEM image. The arithmetic section performs processing to find the directions of the detector segments relative to the STEM image from the direction of a deviation of the STEM image caused by defocusing.

In this electron microscope, the directions of the detector segments relative to the STEM image can be measured easily. Furthermore, in this electron microscope, the directions of the detector segments relative to the STEM image can be measured without using a CCD camera or any other hardware device.

(7) In one feature of this electron microscope, the at least one STEM image is plural in number. The arithmetic section may perform processing to find the directions of the detector segments from the direction of a relative positional deviation between plural ones of the STEM images which are obtained from the same one of the detector segments but which are different in amount of defocus.

(8) In one feature of the electron microscope set forth in (7) above, the arithmetic section may perform processing to find the directions of the detector segments from the direction of a relative positional deviation between the STEM images which are obtained from different ones of the detector segments under a defocused condition.

(9) In another feature of the electron microscope set forth in (6) above, there may be further provided a control unit for providing control based on the directions of the detector segments found by the arithmetic section to vary the directions of the detector segments.

(10) Another electron microscope associated with the present invention is adapted to obtain STEM images by detecting electrons transmitted through a sample and has: a segmented detector having a detection surface for detecting the electrons transmitted through the sample, the detection surface being divided into a plurality of detector segments; and an image processor for performing processing to generate an image indicating the directions of the detector segments relative to the STEM images The image processor generates this image by subtracting one of two STEM images from the other, the two STEM images being obtained from two different ones of the detector segments under a defocused condition.

In this electron microscope, the image processor generates the image by subtracting one of two STEM images obtained from two different ones of the detector segments under a defocused condition from the other and, therefore, the generated image permits one to easily know the directions of the detector segments relative to the STEM images.

(11) In one feature of this electron microscope, the two detector segments may be located at opposite positions.

DESCRIPTION OF THE INVENTION

The preferred embodiments of the present invention are hereinafter described in detail by referring to the accompanying drawings. It is to be understood that the embodiments provided below are not intended to unduly restrict the scope and content of the present invention delineated by the appended claims and that not all the configurations described below are essential constituent components of the invention.

1. First Embodiment 1.1. Electron Microscope

Figure 1:
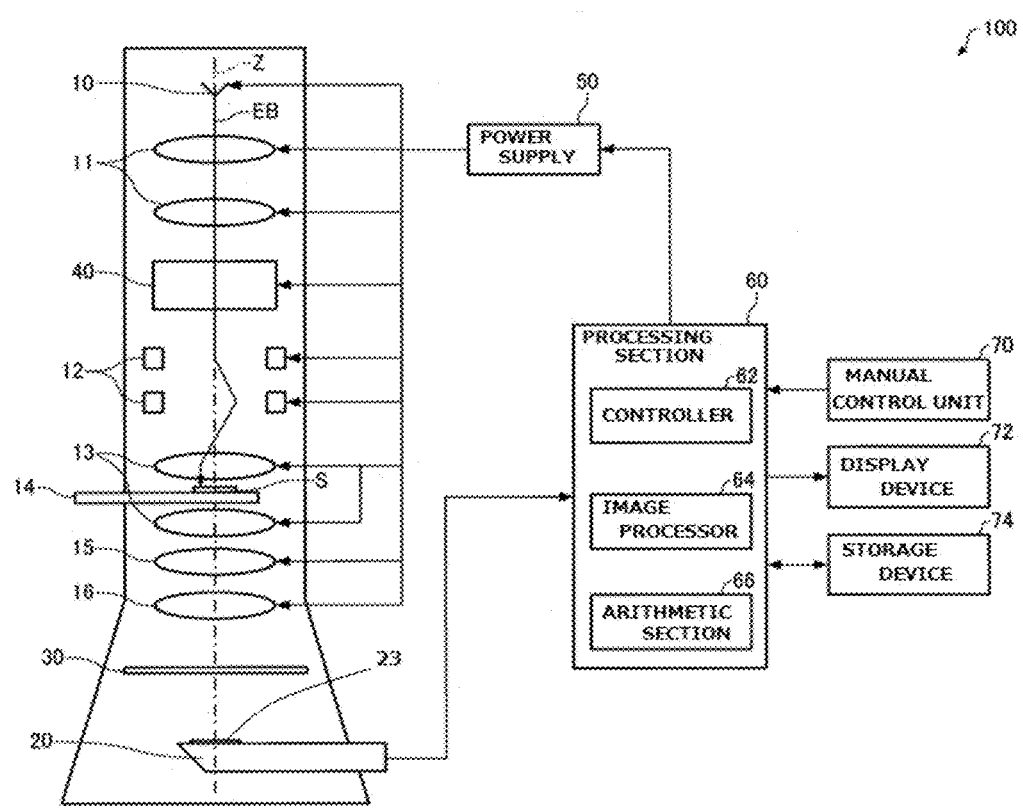
FIG. 1 is a schematic representation, partly in block form, of an electron microscope associated with a first embodiment of the present invention.

An electron microscope associated with a first embodiment of the present invention is first described by referring to FIG. 1, which schematically shows the configuration of the electron microscope, generally indicated by reference numeral 100, associated with the first embodiment.

As shown in FIG. 1, the electron microscope 100 includes an electron beam source 10, an illumination lens system 11, a deflector assembly 12, an objective lens assembly 13, a sample stage 14, an intermediate lens 15, a projector lens 16, a segmented detector 20, a power supply 30, a processing section 40, a manual control unit 50, a display device 52, and a storage device 54.

The electron beam source 10 emits an electron beam EB. For example, a thermionic-emission electron gun, thermal field emission electron gun, cold cathode field-emission electron gun, or other electron gun can be used as the electron beam source 10.

The illumination lens system 11 focuses the electron beam EB produced by the electron beam source 10. The deflector assembly 12 deflects the beam EB. The focused electron beam EB can be scanned over a sample S by supplying a scan signal from the power supply 30 to the deflector assembly 12. Consequently, the electron microscope 100 can be operated as a scanning transmission electron microscope (STEM).

The objective lens assembly 13 operates to focus the electron beam EB onto the sample S and to image the electrons transmitted through the sample S.

The sample stage 14 holds the sample S. Furthermore, the sample stage 14 can move the sample S horizontally or vertically and tilt the sample S.

The intermediate lens 15 focuses the back focal plane (diffraction plane) of the objective lens assembly 13 onto the object plane of the projector lens 16. The projector lens 16 brings the image plane of the intermediate lens 15 into focus on the detection surface 23 of the segmented detector 20. In the electron microscope 100, a scanning transmission electron microscope (STEM) image is taken while bringing the detection surface 23 of the segmented detector 20 into coincidence with the diffraction plane.

Figure 2:
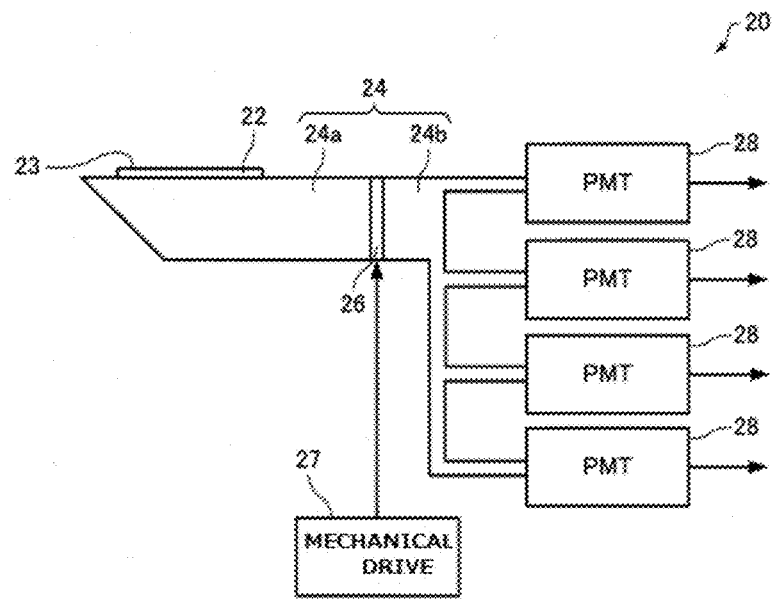
FIG. 2 is a schematic representation of a segmented detector shown in FIG. 1.
Figure 3:
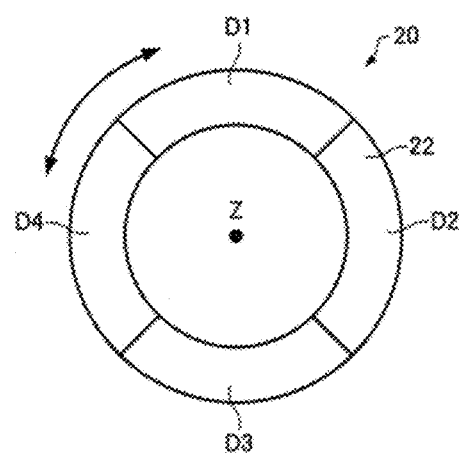
FIG. 3 schematically shows the detection surface of the segmented detector shown in FIGS. 1 and 2.

The segmented detector 20 is mounted behind (on the downstream side relative to the direction of the electron beam EB) the projector lens 16. FIG. 2 schematically shows the configuration of the segmented detector 20. FIG. 3 schematically shows the detection surface 23 of the detector 20.

As shown in FIGS. 2 and 3, the segmented detector 20 has an electron-to-light converter 22 for converting the electron beam into light, an optical transmission pathway 24 for dividing the electron-to-light converter 22 into four detector segments D1, D2, D3, and D4 and conveying the light streams respectively from the detector segments D1-D4, and four light detectors 28 for converting the light streams coming from the detector segments D1-D4 via the optical transmission pathway 24 into their respective electric signals.

The electron-to-light converter 22 is a scintillator or fluorescent screen, for example, and converts the incident electrons into light of intensity that can be detected by the following stage of light detectors 28.

The optical transmission pathway 24 is a bundle of multiple optical fibers. The ends of the fibers on the converter (22) side are bound together to receive light from the whole surface of the electron-to-light converter 22. The ends of the fibers on the opposite side branch into individual fibers to transfer the received light streams to the respective light detectors 28 according to the positions of incidence of the light streams. That is, the optical transmission pathway 24 is so designed that the light-emitting surface of the electron-to-light converter 22 acts as the detection surface 23 divided into the four detector segments D1-D4.

The optical transmission pathway 24 has a rotary portion 26 for rotating the four detector segments D1-D4 within the electron beam incident plane of the electron-to-light converter 22 by varying the light transmission route. The optical transmission pathway 24 is composed of an optical transmission line 24a disposed on the vacuum side and an optical transmission line 24b disposed on the atmospheric side. The transmission lines 24a and 24b are connected together by the rotary portion 26 so as to be rotatable relative to each other. The rotary portion 26 can rotate the optical transmission line 24b about the center axis of the whole optical transmission pathway 24 while maintaining the central axis of the optical transmission pathway 24 unchanged. As a consequence, the detector segments D1-D4 can be rotated.

A mechanical drive 27 can actuate the rotary portion 26, thus rotating the optical transmission line 24b. Each of the light detectors 28 is a composite device of a photomultiplier tube (PMT) and a preamplifier, for example. The light detectors 28 convert the light streams going out of the branching ends of the optical transmission pathway 24 into electric signals and amplify them. The amplified signals are applied as detection signals to the processing section 40, the detection signals representing the electron beam segments incident on the detector segments D1-D4, respectively.

No restriction is imposed on the number of division of the detection surface 23, i.e., the number of the detector segments. That is, the segmented detector 20 can have two or more detector segments. The plural detector segments may be formed by partitioning the detection surface 23 of the segmented detector 20 concentrically and angularly (circumferentially). For example, the segmented detector 20 may have 16 detector segments by dividing the detection surface 23 into four concentrically and into four angularly.

Referring back to FIG. 1, the power supply 30 applies voltages or currents to the electron beam source 10, the electron optics components 11, 12, 13, 15, 16, and the mechanical drive 27 (see FIG. 2) for the segmented detector 20 in response to control signals from a control unit 42.

The manual control unit 50 obtains a control signal responsive to a user's manipulation and performs processing to send the signal to the processing section 40. For example, the manual control unit 50 is composed of buttons, keys, a touch panel display, a microphone, or the like. The manual control unit 50 accepts input values, for example, indicative of a final magnification and a field of view from the user.

The display device 52 displays images generated by the processing section 40. The function of the display device 52 can be implemented by an LCD, a CRT, or the like. For example, the display device 52 displays an STEM image generated by an image processor 44. Furthermore, the display device 52 displays information about the directions of the detector segments D1, D2, D3, and D4 relative to the STEM image, for example, computed by the arithmetic section 46.

The storage device 54 acts as a working area for the processing section 40, and the function of the storage device 54 can be implemented by a RAM or the like. The storage device 54 stores programs, data, and related information permitting the processing section 40 to perform various kinds of control operations and computational operations. The storage device 54 is also used to temporarily store the results of calculations executed by the processing section 40 in accordance with various programs.

The processing section 40 performs various kinds of control operations and computational operations in accordance with programs stored in the storage device 54. The processing section 40 acts as the control unit 42, the image processor 44, and the arithmetic section 46 described further below by executing programs stored in the storage device 54. The functions of the processing section 40 can be implemented by hardware such as various processors (e.g., CPU, DSP, or the like) or ASIC (e.g., a gate array) or software. At least a part of the processing section 40 may be implemented by hardware (dedicated circuitry).

The processing section 40 includes the control unit 42, the image processor 44, and the arithmetic section 46. The control unit 42 performs processing to control output voltages or output currents from the power supply 30 for applying voltages or currents to the electron beam source 10, to the electron optics components 11, 12, 13, 15, and 16 constituting the electron microscope 100, and to the mechanical drive 27 for the segmented detector 20.

The image processor 44 performs processing to generate STEM images using the output signal from the segmented detector 20. For example, the image processor 44 can perform processing to create a bright-field STEM image for each of the detector segments D1-D4 of the segmented detector 20 and to generate an image by adding, subtracting, or otherwise processing the detection signals derived from the detector segments D1, D2, D3, and D4.

The arithmetic section 46 performs processing to find the directions of the detector segments D1, D2, D3, and D4 of the segmented detector 20 relative to the STEM image. The arithmetic section 46 measures the directions of the detector segments D1, D2, D3, and D4 relative to the STEM image from the direction of a deviation of the STEM image caused by a defocus.

Figure 4:
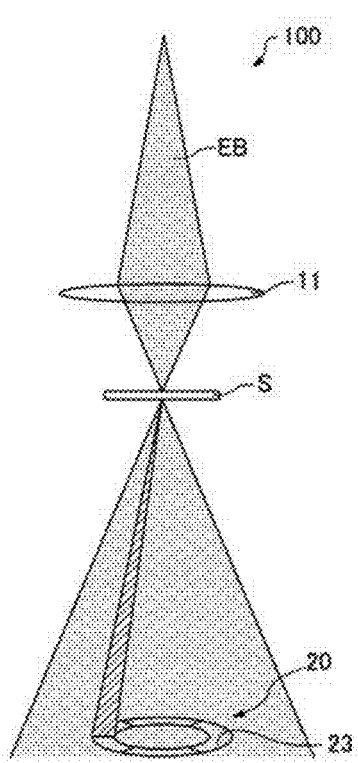
FIGS. 4, 5, and 6 are electron-optical ray diagrams illustrating a technique of finding the directions of detector segments of the segmented detector shown in FIGS. 1-3.
Figure 5:
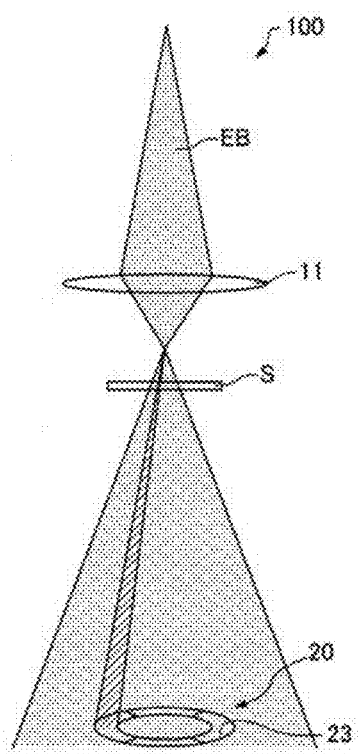

A technique of finding the directions of the detector segments D1, D2, D3, and D4 of the segmented detector 20 relative to the STEM image is described below. FIGS. 4 and 5 illustrate the technique of finding the directions of the detector segments D1, D2, D3, and D4 of the segmented detector 20 relative to the STEM image. FIG. 4 shows an exactly focused state, while FIG. 5 shows an overfocused state.

In the exactly focused state shown in FIG. 4, the electron beam EB detected by the detector segments passes through one point on the sample S. On the other hand, in the overfocused state shown in FIG. 5, the image blurs and, at the same time, the position on the sample surface through which the beam EB passes is closer toward the active detector segment used actually for detection. Under this condition, if the beam is scanned over the sample S, the obtained bright-field STEM image moves away from the active detector segment. By detecting this motion, the relationship between the direction of the active detector segment and the STEM image (the direction of scanning), i.e., the direction of the active detector segment relative to the STEM image, can be known. In this way, the direction of the active detector segment relative to the STEM image can be measured from the direction of a deviation of the STEM image caused by a defocus.

An example has been described in which the direction of a detector segment is measured under an overfocused condition created. Similarly, the direction of a detector segment can be measured under an underfocused condition created.

Figure 6:
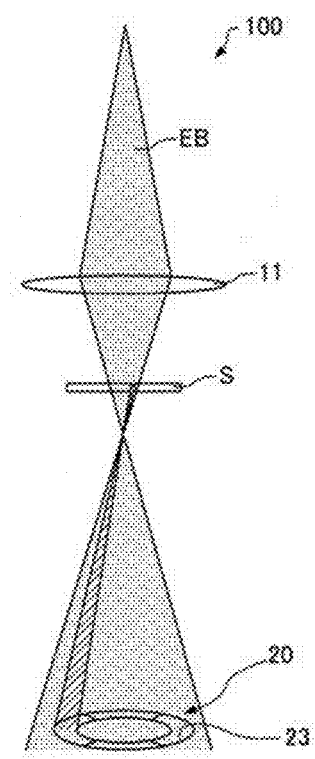

FIG. 6 also illustrates the technique for finding the directions of the detector segments D1, D2, D3, and D4 of the segmented detector 20 relative to an STEM image. FIG. 6 illustrates an underfocused condition.

If an underfocused condition is established, the position on the sample surface through which the electron beam EB passes moves away from the active detector segment used actually for detection as shown in FIG. 6. Under this condition, if the beam is scanned over the sample S, and if the image is a bright-field STEM image, the image moves toward the active detector segment, thus revealing the relationship between the direction of the active detector segment and the STEM image. That is, in the case of the underfocused condition shown in FIG. 6, the direction of motion of the image relative to the active detector segment is reversed as compared with the case of the overfocused condition shown in FIG. 5 but the direction of the active detector segment relative to the STEM image can be similarly measured.

The processing performed by the arithmetic section 46 is next described. In order to find the direction of a deviation of an STEM image arising from a defocus, the arithmetic section 46 finds the direction of a relative positional deviation between STEM images which are obtained from the same one of the detector segments D1, D2, D3, and D4 and which are different in amount of defocus, and finds the directions of the detector segments D1-D4 from the direction of the positional deviation.

First, the arithmetic section 46 obtains two STEM images which are different in amount of focus from the same one of the detector segments (e.g., the detector segment D1).

Figure 7:
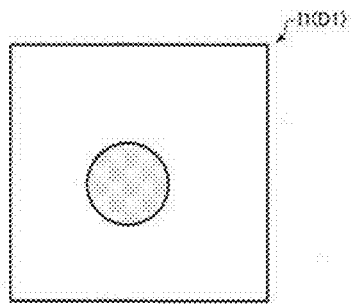
FIGS. 7A and 7B are schematic representations of two differently defocused STEM images.
FIG. 7C is a schematic representation showing the state of the detection surface of the segmented detector shown in FIGS. 1-3.
Figure 7:
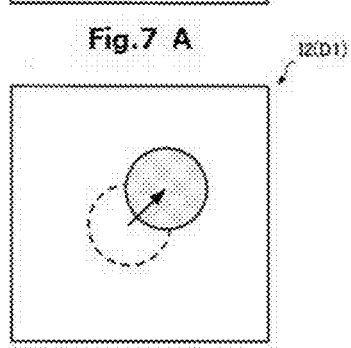
Figure 7:
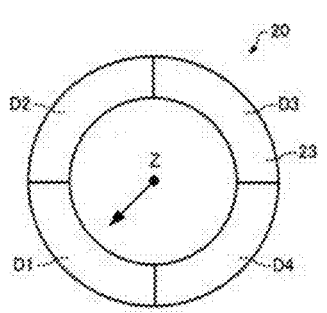

FIGS. 7A and 7B schematically show an STEM image I1(D1) and an STEM image I2(D1), respectively, which have been obtained from the detector segment D1 but which are different in amount of defocus. These two STEM images I1(D1) and I2(D1) have been taken under an overfocused state. The STEM image I2(D1) is more defocused than the STEM image I1(D1). The STEM image I1(D1) and STEM image I2 (D1) have been taken under the same imaging conditions (such as the field of view and the magnification) except for the amount of defocus. FIG. 7C schematically shows the state of the detection surface 23 assumed when the STEM images I1(D1) and I2(D1) are captured.

The arithmetic section 46 takes a cross-correlation between the obtained STEM image I1(D1) and STEM image I2(D1) and finds the direction of the positional deviation between these two STEM images I1(D1) and I2(D1). As described previously, a direction (indicated by the arrow in FIG. 7C) opposite to the direction of a positional deviation occurring when the state is varied to an overfocused state (i.e., a direction opposite to the direction of a positional deviation taking place when a change is made from the STEM image I1(D1) to the STEM image I2(D1)) (indicated by the arrow in FIG. 7B) is the direction of the detector segment D1 relative to an optical axis Z that passes through the center of the optical system constituting the electron microscope 100. In this way, the arithmetic section 46 can find the direction of the detector segment D1.

After performing the above-described processing using three or more differently defocused STEM images which are obtained from the detector segment D1, the arithmetic section 46 may perform processing to find the direction of the detector segment D1 by a least squares method or other method. Consequently, the measurement accuracy can be enhanced further.

The arithmetic section 46 performs similar processing on STEM images obtained from the other detector segments D2, D3, and D4 to find the directions of the detector segments D2, D3, and D4. As a result, the directions of the detector segments D1, D2, D3, and D4 relative to the STEM images, i.e., the angular positional relationship of the STEM images to the detector segments D1, D2, D3, and D4, can be found.

Information about the directions of the detector segments D1, D2, D3, and D4 relative to the STEM images found by the arithmetic section 46 is displayed, for example, on the display device 52.

Furthermore, the control unit 42 provides control based on the information about the directions of the detector segments D1-D4 relative to the STEM images found by the arithmetic section 46 to vary the directions of the detector segments D1-D4. For example, the control unit 42 provides control based on the information about the directions of the detector segments D1-D4 found by the arithmetic section 46 to rotate the optical transmission line 24b to preset directions of the detector segments D1-D4. Consequently, the detector segments D1-D4 can be directed to desired directions.

In the description of the above embodiment, the segmented detector 20 has the four detector segments D1, D2, D3, and D4 and the arithmetic section 46 finds the directions of the four detector segments D1-D4. Where the segmented detector 20 has five or more detector segments or three or less detector segments, the arithmetic section 46 can find the directions of the detector segments by a similar technique.

The electron microscope 100 has the following features. In the electron microscope 100, the arithmetic section 46 performs processing to find the directions of the detector segments D1, D2, D3, and D4 relative to STEM images from the directions of deviations among the STEM images caused by defocusing. In particular, the arithmetic section 46 performs processing to find the directions of the detector segments D1, D2, D3, and D4 from the directions of relative positional deviations among plural STEM images which are derived from the same detector segment but which are different in amount of defocus. Therefore, in the electron microscope 100, the directions of the detector segments D1, D2, D3, and D4 relative to the STEM images can be measured easily. In addition, with the electron microscope 100, a user can perform work to vary the directions of the detector segments D1-D4 by checking information about the directions of the detector segments D1-D4 that is displayed on the display device 52 in real time, for example, while observing the actual STEM images.

Further, in the electron microscope 100, the directions of the detector segments D1, D2, D3, and D4 can be found from STEM images derived from the segmented detector 20 and so the CCD camera or any other hardware device can be dispensed with.

1.2. Measurement Method

Figure 8:
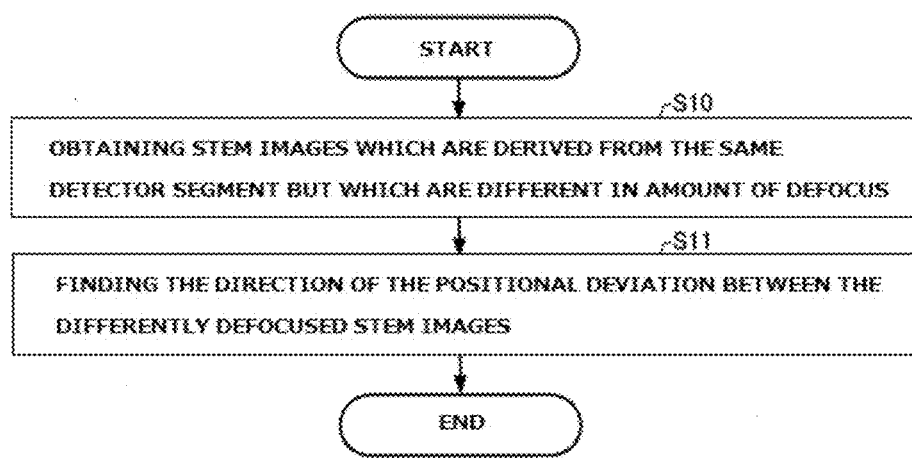
FIG. 8 is a flowchart illustrating one example of the measurement method associated with the first embodiment.

A measurement method of measuring the directions of the detector segments D1, D2, D3, and D4 relative to STEM images by the use of the electron microscope 100 associated with the first embodiment is next described. FIG. 8 is a flowchart illustrating one example of the measurement method using the electron microscope 100 associated with the first embodiment.

For example, if a user asks the processing section 40 via the manual control unit 50 to start the processing for measuring the directions of the detector segments D1, D2, D3, and D4 relative to STEM images, the processing section 40 accepts a control signal from the manual control unit 50 and initiates the processing.

First, the arithmetic section 46 obtains STEM images which are derived from the same detector segment but which are different in amount of defocus (step S10).

In particular, STEM images are first captured in the electron microscope 100. In this microscope 100, the electron beam EB emitted from the electron beam source 10 is overfocused by the illumination lens system 11 and focused onto the sample S by the objective lens assembly 13. The processing section 40 accepts the detection signals from the detector segments D1, D2, D3, and D4 of the segmented detector 20 while the focused beam EB is scanned over the sample S by the deflector assembly 12. The image processor 44 takes the intensity of each detection signal arising from each point on the sample S as a pixel intensity on an image and generates an STEM image (bright-field STEM image) for each of the detector segments D1, D2, D3, and D4. The generated STEM images for the detector segments D1, D2, D3, and D4 are stored in the storage device 54.

Then, image captures are similarly performed while varying the amount of defocus by the illumination lens system 11. STEM images for the detector segments D1, D2, D3, and D4 are stored in the storage device 54. The arithmetic section 46 reads information about these STEM images from the storage device 54 and obtains two differently defocused STEM images for each of the detector segments D1, D2, D3, and D4.

The control unit 42 can automate the image captures of the differently defocused STEM images by controlling the optics 11, 12, 13, 15, and 16 via the power supply 30. Then, the arithmetic section 46 finds the direction of the positional deviation between the differently defocused STEM images arising from the same detector segment (step S11).

As described previously, the arithmetic section 46 takes a cross-correlation between the differently defocused STEM images arising from the same detector segment and finds the direction of the positional deviation between the STEM images. As a consequence, the directions of the detector segments D1, D2, D3, and D4 relative to the STEM images can be found.

Information about the directions of the detector segments D1, D2, D3, and D4 relative to the STEM images is displayed on the display device 52 by the processing section 40. Furthermore, the control unit 42 provides control based on the information about the directions of the detector segments D1, D2, D3, and D4 relative to the STEM images found by the arithmetic section 46 to vary the directions of the detector segments D1-D4. The processing section 40 terminates the present processing routine.

The measurement method associated with the present embodiment involves measuring the directions of the detector segments D1, D2, D3, and D4 relative to the STEM images from the direction of the deviation between the STEM images caused by defocusing. In particular, during the step of measuring the directions of the detector segments D1, D2, D3, and D4, the direction of each of the detector segments D1, D2, D3, and D4 is found from the direction of a relative positional deviation between the differently defocused STEM images derived from the same one of the detector segments D1-D4. Accordingly, in the measurement method associated with the present embodiment, the directions of the detector segments D1, D2, D3, and D4 relative to the STEM images can be measured easily. Furthermore, the directions of the detector segments D1, D2, D3, and D4 can be measured without using a CCD camera or any other hardware device.

2. Second Embodiment

2.1. Electron Microscope

An electron microscope associated with a second embodiment is next described. This microscope associated with the second embodiment is similar in configuration to the above-described electron microscope 100 shown in FIG. 1 and thus is omitted from being shown. Only the differences with the electron microscope 100 associated with the first embodiment are described below; a description of similarities is omitted herein.

In the electron microscope 100 associated with the first embodiment, the arithmetic section 46 finds the direction of a relative positional deviation between differently defocused STEM images obtained from the same one of the detector segments D1, D2, D3, and D4, finds the direction of the deviation between the STEM images caused by the defocusing, and measures the directions of the detector segments D1, D2, D3, and D4 relative to the STEM images.

On the other hand, in the electron microscope associated with the second embodiment, the arithmetic section 46 finds the directions of the detector segments D1, D2, D3, and D4 from the directions of relative positional deviations between differently defocused STEM images derived from different ones of the detector segments D1, D2, D3, and D4 to thereby find the direction of the deviation between the STEM images caused by the defocusing, and measures the directions of the detector segments D1, D2, D3, and D4 relative to the STEM images.

Processing performed by the arithmetic section 46 is described below. The arithmetic section 46 first obtains STEM images from different detector segments under a defocused condition.

Figure 9:
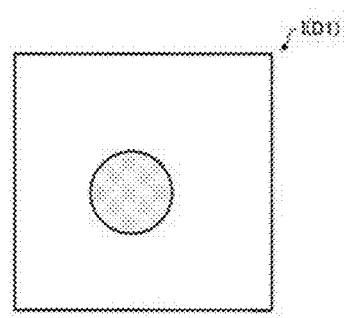
FIG. 9A is a schematic representation of an STEM image obtained from a detector segment D1 under a defocused state.
FIG. 9B is a schematic representation of an STEM image obtained from a detector segment D3 under a defocused state.
FIG. 9C is a schematic representation showing the state of the detection surface of the segmented detector shown in FIGS. 1-3.
Figure 9:
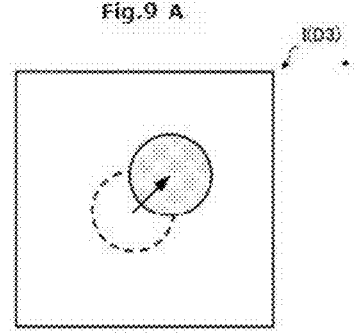
Figure 9:
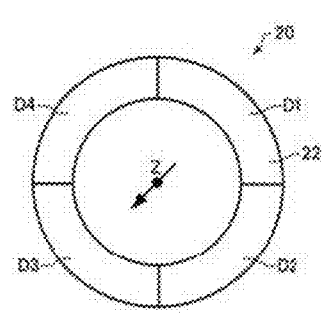

FIG. 9A schematically shows an STEM image I(D1) obtained from the detector segment D1 under a defocused condition. FIG. 9B schematically shows an STEM image I(D3) obtained from the detector segment D3 under a defocused condition. These STEM images I(D1) and I(D3) have been simultaneously captured under an overfocused condition. That is, the imaging conditions such as field of view and magnification are the same for both the STEM images I(D1) and I(D3) except for detector segments. FIG. 9C schematically shows the state of the detection surface 23 when the STEM images I(D1) and I(D3) are captured.

The arithmetic section 46 takes a cross-correlation between the obtained STEM images I(D1) and I(D3) and finds the direction of a positional deviation between these STEM images I(D1) and I(D3). A direction opposite to the direction of the positional deviation of the STEM image I(D3) (the direction of the arrow in FIG. 9B) relative to the STEM image I(D1) is a direction running from the detector segment D1 toward the detector segment D3 (the direction of the arrow in FIG. 9C). In this way, the arithmetic section 46 can find the directions of the detector segments D1 and D3.

The arithmetic section 46 performs the above-described processing on the combinations of the detector segments D1, D2, D3, and D4, for example, as well as on the combination of the detector segments D1 and D3. Then, the arithmetic section 46 may perform processing to find the directions of the detector segments D1, D2, D3, and D4 by a least squares method or other method. Consequently, the measuring accuracy can be enhanced further.

The electron microscope associated with the second embodiment can yield advantageous effects similar to those of the electron microscope 100 associated with the above-described first embodiment. Furthermore, the electron microscope associated with the second embodiment can obtain STEM images used for measurements only in one image capture operation. Therefore, the number of STEM images captured can be reduced as compared with the electron microscope 100 associated with the first embodiment in which two image captures are done while varying the amount of defocus.

2.2. Measurement Method

Figure 10:
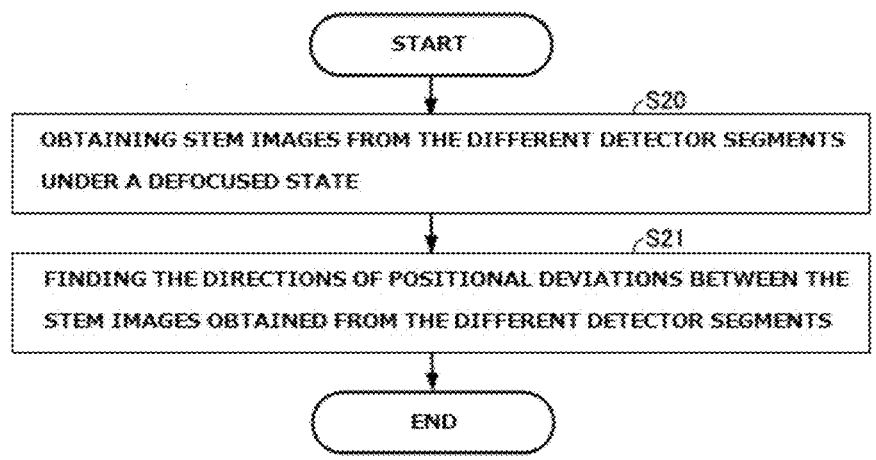
FIG. 10 is a flowchart illustrating one example of the measurement method associated with a second embodiment.

A measurement method for measuring the directions of the detector segments D1, D2, D3, and D4 relative to STEM images by the use of the electron microscope associated with the second embodiment is next described. FIG. 10 is a flowchart illustrating one example of the measurement method using the electron microscope associated with the second embodiment. Only the differences with the measurement method associated with the first embodiment are described below; a description of similarities is omitted.

First, the arithmetic section 46 obtains STEM images from the different detector segments D1, D2, D3, and D4 under a defocused state (step S20).

In particular, the electron microscope first captures STEM images. In the electron microscope 100, the electron beam EB emitted from the electron beam source 10 is overfocused by the illumination lens system 11 and focused onto the sample S by the objective lens assembly 13. The processing section 46 accepts detection signals from the detector segments D1, D2, D3, and D4 of the segmented detector 20 while scanning the focused beam EB over the sample S by the deflector assembly 12. The image processor 44 takes the intensity of each detection signal arising from each point on the sample S as a pixel intensity on an image and generates an STEM image for each of the detector segments D1, D2, D3, and D4. The generated STEM images for the detector segments D1, D2, D3, and D4 are stored in the storage device 54.

The arithmetic section 46 reads information about these STEM images from the storage device 54 and obtains STEM images derived from the different detector segments D1, D2, D3, and D4.

The arithmetic section 46 then finds the directions of positional deviations between the STEM images obtained from the different detector segments D1, D2, D3, and D4 (step S21).

The arithmetic section 46 takes a cross-correlation between the STEM images obtained from the different detector segments D1, D2, D3, and D4 and finds the directions of the detector segments D1, D2, D3, and D4 as described previously. Consequently, the directions of the detector segments D1, D2, D3, and D4 relative to the STEM images can be found.

The measurement method associated with the second embodiment can yield advantageous effects similar to those produced by the measurement method associated with the first embodiment. Furthermore, the measurement method associated with the second embodiment can obtain STEM images used for measurement in one image capture operation and thus can reduce the number of operations for capturing STEM images as compared with the measurement method associated with the first embodiment.

3. Third Embodiment 3.1. Electron Microscope

Figure 11:
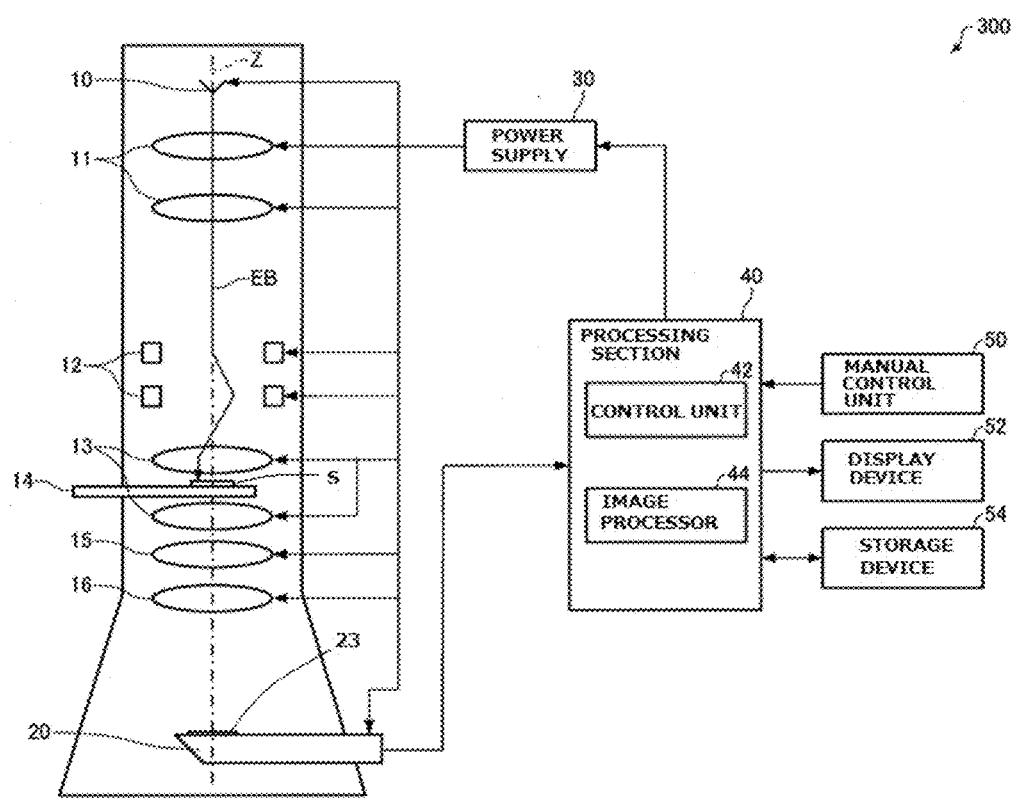
FIG. 11 is a schematic vertical cross-sectional view, partly in block form, of an electron microscope associated with a third embodiment.

An electron microscope associated with a third embodiment of the invention is next described by referring to FIG. 11, which schematically shows the configuration of the electron microscope, generally indicated by reference numeral 300, associated with the third embodiment. Those members of the electron microscope 300 which are similar in function with their respective counterparts of the electron microscope 100 associated with the first embodiment are indicated by the same reference numerals as in the above-referenced figures and a detailed description thereof is omitted.

The electron microscope 300 associated with the third embodiment differs from the electron microscope 100 associated with the first embodiment in that the image processor 44 generates an image by subtracting one of two STEM images obtained from two different detector segments under a defocused state from the other.

The processing performed by the image processor 44 is hereinafter described. The image processor 44 first obtains defocused STEM images derived from detector segments arranged in different positions.

Figure 12:
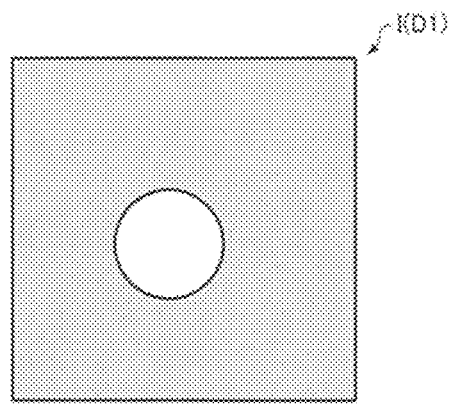
FIG. 12A is a schematic representation of an STEM image obtained from the detector segment D1 under a defocused state.
FIG. 12B is a schematic representation of an STEM image obtained from the detector segment D3 under a defocused state.
Figure 12:
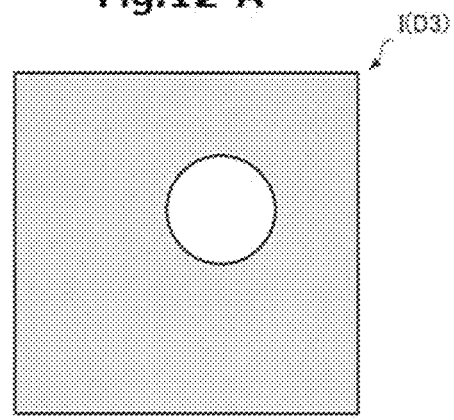

FIG. 12A shows an STEM image I(D1) obtained from the detector segment D1 under a defocused state. FIG. 12B shows an STEM image I(D3) obtained from the detector segment D3 under a defocused state. These STEM images I(D1) and I(D3) have been simultaneously captured in an overfocused state. That is, the imaging conditions (such as field of view and magnification) are the same for both the STEM images I(D1) and I(D3) except for detector segments.

Then, the image processor 44 performs processing to generate an image I(D1-D3) by subtracting the STEM image I(D3) from the STEM image I(D1). The image processor 44 generates the image I(D1-D3) by subtracting the intensity of each pixel of the STEM image I(D3) from the intensity of its respective pixel of the STEM image I(D1). The image processor 44 performs processing to display the generated image I(D1-D3) on the display device 52.

Figure 13:
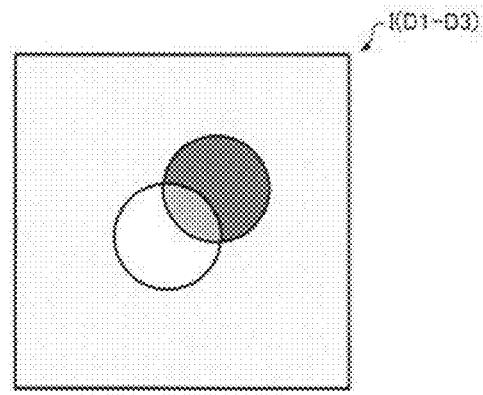
FIG. 13A is a schematic representation of an image I(D1-D3) generated by the image processor of the electron microscope shown in FIG. 11.
FIG. 13B is a schematic representation showing the state of the detection surface of the segmented detector shown in FIG. 11.
Figure 13:
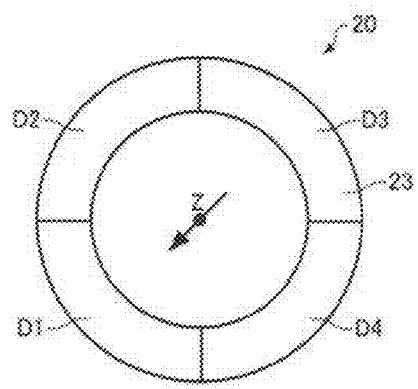

FIG. 13A schematically shows the image I(D1-D3) generated by the image processor 44. FIG. 13B schematically shows the state of the detection surface 23 when the STEM images I(D1) and I(D3) are captured.

As shown in FIG. 13A, a light-dark contrast is produced on the image I(D1-D3) in the direction going from the detector segment D1 toward the detector segment D3 as indicated by the arrow in FIG. 13B. Accordingly, by checking the image I(D1-D3), the directions of the detector segments D1 and D3 relative to the STEM images can be known.

An example has been presented in which the image processor 44 generates an image by subtracting one of two STEM images derived from oppositely located detector segments D1 and D3 from the other. The invention is not restricted to this example. Where the image processor 44 performs processing to generate an image by subtracting one of two STEM images derived from different detector segments from the other, the directions of the detector segments can be known similarly from the generated image.

In the electron microscope 300 associated with the third embodiment, the image processor 44 generates an image by subtracting one of STEM images obtained from two different detector segments under a defocused condition from the other. Therefore, the directions of the detector segments D1, D2, D3, and D4 relative to the STEM images can be readily known from this generated image. Consequently, in the electron microscope 300, the detector segments D1, D2, D3, and D4 can be rotated to desired directions, for example, in real time while the user is watching the images displayed on the display device 52.

3.2. Measurement Method

Figure 14:
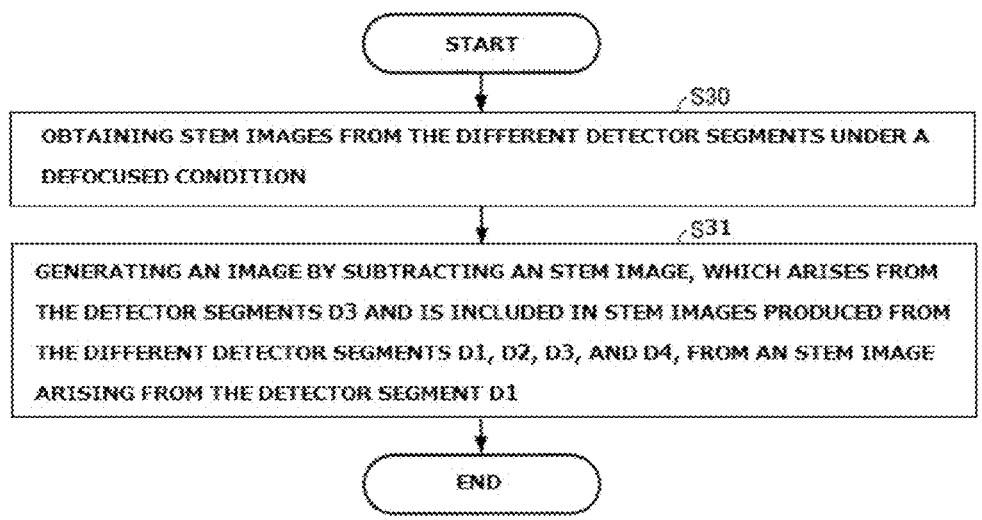
FIG. 14 is a flowchart illustrating one example of the measurement method associated with the third embodiment.
Figure 15:
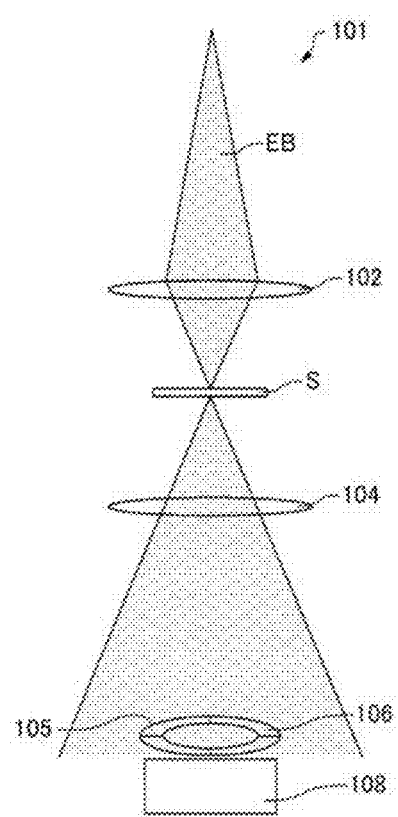
FIG. 15 is a schematic electron-optical ray diagram illustrating the configuration of an electron microscope equipped with a conventional segmented detector.
Figure 16:
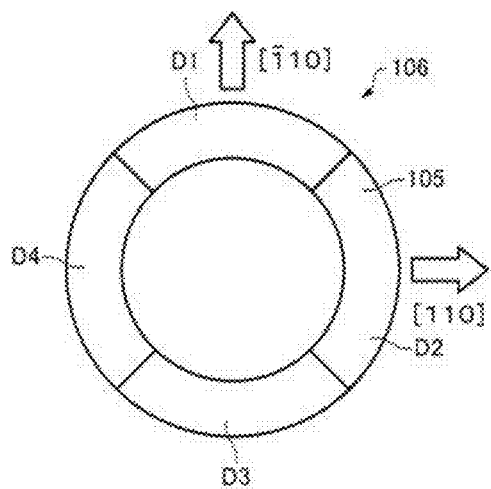
FIG. 16A is a schematic representation illustrating one example of the relative azimuthal relationship between the crystallographic orientation of a sample and each detector segment of the conventional segmented detector shown in FIG. 15.
FIG. 16B is a schematic representation of images I(D2-D4) and I(D1-D3).
Figure 16:
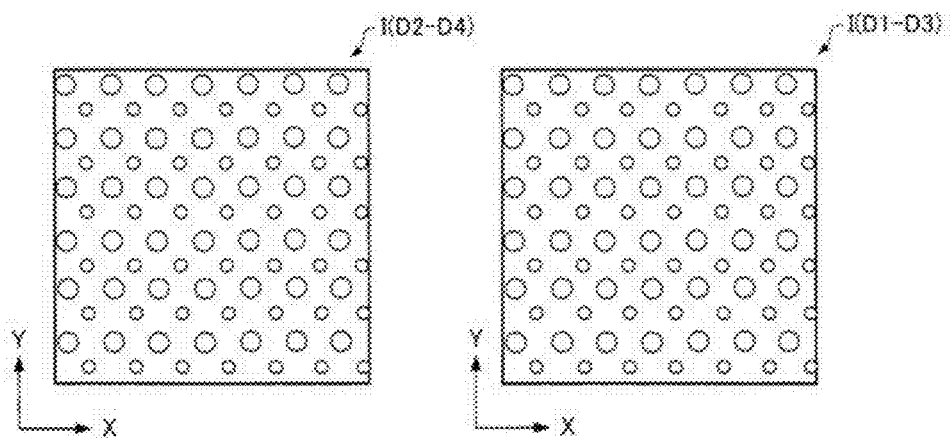
Figure 17:
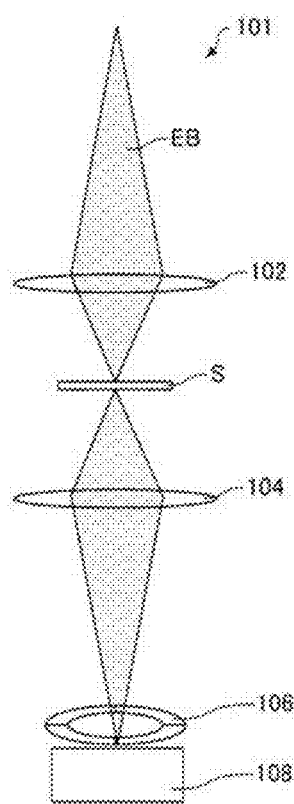
FIG. 17 is an electron-optical ray diagram illustrating a conventional measurement method.
Figure 18:
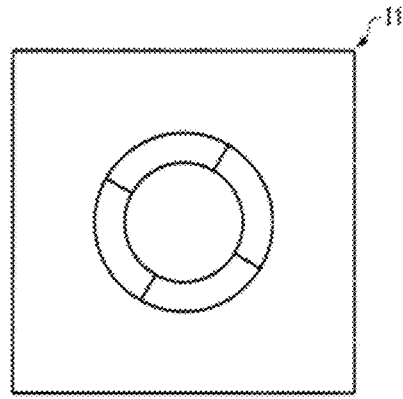
FIGS. 18-22 are schematic representations illustrating the conventional measurement method.
Figure 19:
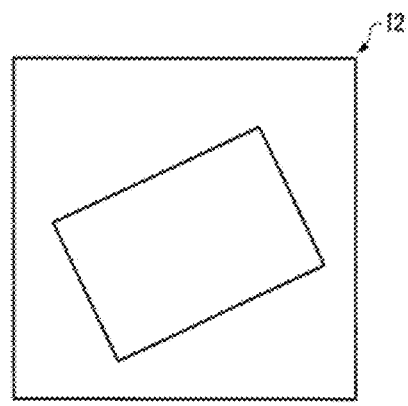
Figure 20:
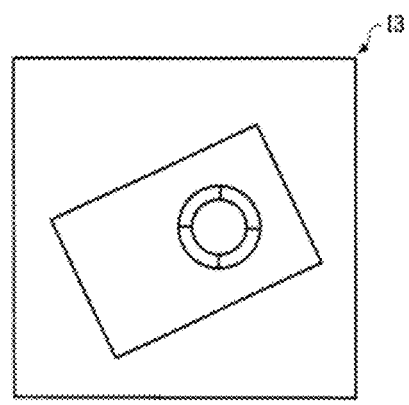
Figure 21:
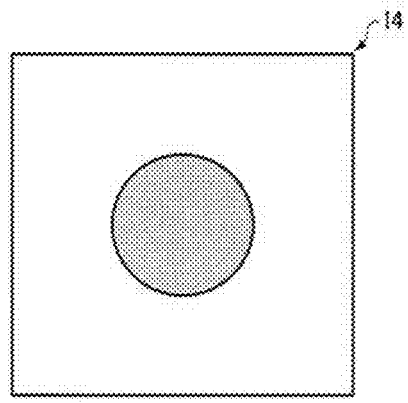
Figure 21:
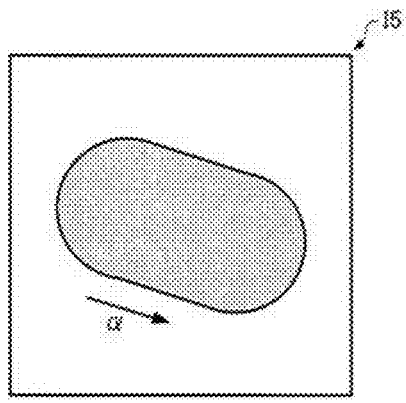
Figure 22:
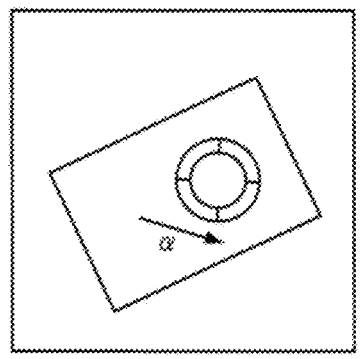

A measurement method for measuring the directions of the detector segments D1, D2, D3, and D4 relative to STEM images through the use of the electron microscope 300 associated with the third embodiment is next described by referring to FIG. 14, which is a flowchart illustrating one example of the measurement method using the electron microscope 300 associated with the third embodiment. Only the differences with the measurement methods associated with the first and second embodiments are described below; a description of similarities is omitted.

First, the image processor 44 obtains STEM images from the different detector segments D1, D2, D3, and D4 under a defocused condition (step S30).

In particular, in the electron microscope 300, STEM images are first captured. The image processor 44 reads information about the captured STEM images from the storage device 54 and obtains the STEM images arising from the different detector segments D1, D2, D3, and D4.

Then, the image processor 44 generates an image by subtracting an STEM image, which arises from the detector segments D3 and is included in STEM images produced from the different detector segments D1, D2, D3, and D4, from an STEM image arising from the detector segment D1 located opposite to the detector segment D3 (step S31).

The image processor 44 displays the generated image on the display device 52. Consequently, the directions of the detector segments D1 and D3 relative to the STEM images can be found.

According to the measurement method associated with the third embodiment, the directions of the detector segments D1, D2, D3, and D4 relative to STEM images can be easily known from an image that is obtained by subtracting one of STEM images derived from two different detector segments under a defocused condition from the other. Consequently, the detector segments D1, D2, D3, and D4 can be rotated to desired directions while watching the image displayed, for example, in real time on the display device 52.

4. Modification

It is to be understood that the present invention is not restricted to the foregoing embodiments but rather they can be practiced in various modified forms without departing from the gist and scope of the present invention.

For example, regarding one of the above-described embodiments, an example has been described in which the optical transmission line 24b (see FIG. 2) of the segmented detector 20 is rotated as a method of rotating the detector segments D1, D2, D3, and D4. The method of rotating the detector segments D1, D2, D3, and D4 is not restricted to this. For example, in the electron microscope 100 shown in FIG. 1, a lens (not shown) for rotating the electron beam transmitted through the sample S may be mounted between the sample S and the electron-to-light converter 22 (detection surface 23) of the segmented detector 20. This rotating lens is an axisymmetric lens, for example, and disposed between the intermediate lens 15 and the projector lens 16. The detector segments D1, D2, D3, and D4 can be rotated relative to STEM images by rotating the images by means of the rotating lens.

Furthermore, in the description of the above embodiments, an apparatus has been cited as an example in which the segmented detector 20 whose detection surface is divided into the plural detector segments is configured including the electron-to-light converter 22, the optical transmission pathway 24, and the light detectors 28 as shown in FIG. 2. The segmented detector is not restricted to this configuration as long as the detector can detect motion of transmitted electrons. For example, a CCD (charge-coupled device) camera may be used as the segmented detector for use in the electron microscope associated with the present invention.

For instance, where the detection surface of a CCD camera consisting of a two-dimensional array of pixels is divided into and used as a plurality of detector segments, the directions of the detector segments relative to STEM images can be measured by employing any one of the above embodiments.

It is to be understood that the above-described embodiments are merely exemplary and that the invention is not restricted thereto. For example, the above embodiments may be appropriately combined.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. A measurement method for use in an electron microscope equipped with a segmented detector having a detection surface that is divided into a plurality of detector segments, the method being adapted to measure the directions of the detector segments relative to at least one STEM (scanning transmission electron microscope) image, said measurement method comprising the steps of:
    defocusing the STEM image to thereby cause a deviation of the STEM image; and
    measuring the directions of the detector segments relative to the STEM image from the direction of the deviation of the STEM image.

2. The measurement method as set forth in claim 1, wherein said at least one STEM image is plural in number, and wherein, during the step of measuring the directions of the detector segments, the directions of the detector segments are found from the direction of a relative positional deviation between plural ones of said STEM images which are obtained from the same one of the detector segments but which are different in amount of defocus.

3. The measurement method as set forth in claim 1, wherein, during the step of measuring the directions of the detector segments, the directions of the detector segments are found from the direction of a relative positional deviation between plural different ones of said STEM images which are obtained from the detector segments under a defocused condition.

4. The measurement method as set forth in claim 1, wherein two STEM images are obtained as said at least one STEM image from two different ones of the detector segments under a defocused condition, and wherein, during the step of measuring the directions of the detector segments, an image is generated by subtracting one of these two STEM images from the other.

5. The measurement method as set forth in claim 4, wherein said two detector segments are located at opposite positions.

6. An electron microscope for obtaining at least one STEM (scanning transmission electron microscope) image by detecting electrons transmitted through a sample, said electron microscope comprising:
   a segmented detector having a detection surface for detecting the electrons transmitted through the sample, the detection surface being divided into a plurality of detector segments; and
   a processing section operated according to a stored program for obtaining STEM images derived from the same detector segment at different amounts of defocus;
   said processing section including an arithmetic section operated according to a stored program for finding the directions of the detector segments relative to the STEM image from the direction of a deviation of the STEM image caused by defocusing.

7. An electron microscope for obtaining at least one STEM (scanning transmission electron microscope) image by detecting electrons transmitted through a sample, said electron microscope comprising:
   a segmented detector having a detection surface for detecting the electrons transmitted through the sample, the detection surface being divided into a plurality of detector segments; and
   a processing section operated according to a stored program for obtaining STEM images derived from the different detector segments at the same amount of defocus;
   said processing section including an arithmetic section operated according to a stored program for finding the directions of the detector segments relative to the STEM image from the direction of a deviation of the STEM image caused by defocusing.

8. The electron microscope as set forth in claim 6, further comprising a control unit for providing control based on the directions of the detector segments found by the arithmetic section to vary the directions of the detector segments.

9. An electron microscope for obtaining STEM images by detecting electrons transmitted through a sample, said electron microscope comprising:
   a segmented detector having a detection surface for detecting the electrons transmitted through the sample, the detection surface being divided into a plurality of detector segments; and
   a processing section operated according to stored programs for obtaining STEM images derived from the different detector segments at the same amount of defocus;
   said processing section including an image processor operated according to a stored program for performing processing to generate an image indicating the directions of the detector segments relative to the STEM images;
   wherein said image processor generates this image by subtracting one of two STEM images from the other, the two STEM images being obtained from two different ones of the detector segments under a defocused condition.

10. The electron microscope as set forth in claim 9, wherein said two detector segments are located at opposite positions.

* * * * *